(12) United States Patent
Kim et al.

(10) Patent No.: US 10,811,572 B2
(45) Date of Patent: Oct. 20, 2020

(54) LIGHT EMITTING DEVICE (71) Applicant: Seoul Semiconductor Co., Ltd., Ansan-si (KR)

(72) Inventors: Myung Jin Kim, Ansan-si (KR); Kwang Yong Oh, Ansan-si (KR); Ki Bum Nam, Ansan-si (KR); Ji Youn Oh, Ansan-si (KR); Sang Shin Park, Ansan-si (KR); Michael Lim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 123 days.

(21) Appl. No.: 15/518,170

(22) PCT Filed: Oct. 7, 2015

(86) PCT No.: PCT/KR2015/010590
§ 371 (c)(1),
(2) Date: Apr. 10, 2017

(87) PCT Pub. No.: WO2016/056837
PCT Pub. Date: Apr. 14, 2016

(65) Prior Publication Data
US 2017/0309795 A1 Oct. 26, 2017

(30) Foreign Application Priority Data

Oct. 8, 2014 (KR) .................. 10-2014-0136095
Jan. 16, 2015 (KR) .................. 10-2015-0008212
Jan. 16, 2015 (KR) .................. 10-2015-0008213

(51) Int. Cl.
*H01L 33/50* (2010.01)
*H01L 33/48* (2010.01)
(Continued)

(52) U.S. Cl.
CPC ........ *H01L 33/504* (2013.01); *C09K 11/0883* (2013.01); *C09K 11/617* (2013.01);
(Continued)

(58) Field of Classification Search
CPC .............. C09K 11/0883; C09K 11/617; C09K 11/7774; H01L 33/486; H01L 33/504; H01L 33/56; H01L 33/60; H01L 2924/181
See application file for complete search history.

(56) References Cited

U.S. PATENT DOCUMENTS 9,647,181 B2  5/2017 Ishizaki
9,657,221 B2  5/2017 Tsumori et al.
(Continued)

FOREIGN PATENT DOCUMENTS

EP  2 432 037  3/2012
EP  2650934  10/2013
(Continued)

OTHER PUBLICATIONS

International Search Report dated Feb. 26, 2016, in PCT/KR2015/010590.
(Continued)

*Primary Examiner* — Thanhha S Pham
(74) *Attorney, Agent, or Firm* — H.C. Park & Associates (57) ABSTRACT

A light emitting diode package includes: a housing; a light emitting diode chip arranged in the housing; a wavelength conversion unit arranged on the light emitting diode chip; a first fluorescent substance distributed inside the wavelength conversion unit and emitting light having a peak wavelength in the cyan wavelength band; and a second fluorescent substance distributed inside the wavelength conversion unit and emitting light having a peak wavelength in the red wavelength band, wherein the peak wavelength of light
(Continued)

emitted from the light emitting diode chip is located within a range of 415 nm to 430 nm.

20 Claims, 4 Drawing Sheets (51) Int. Cl.
H01L 33/60 (2010.01)
C09K 11/08 (2006.01)
C09K 11/61 (2006.01)
C09K 11/77 (2006.01)
H01L 33/56 (2010.01)

(52) U.S. Cl.
CPC ...... C09K 11/7734 (2013.01); C09K 11/7774 (2013.01); H01L 33/486 (2013.01); H01L 33/50 (2013.01); H01L 33/56 (2013.01); H01L 33/60 (2013.01); H01L 2924/181 (2013.01)

(56) References Cited

U.S. PATENT DOCUMENTS

| | | | |
|---|---|---|---|
| 2007/0182323 A1 | 8/2007 | Ogata et al. | |
| 2008/0198573 A1* | 8/2008 | Justel | C09K 11/7706 362/84 |
| 2008/0211386 A1 | 9/2008 | Choi et al. | |
| 2009/0224652 A1* | 9/2009 | Li | C09K 11/0883 313/498 |
| 2010/0078669 A1* | 4/2010 | Cho | H01L 33/46 257/98 |
| 2010/0084962 A1* | 4/2010 | Winkler | C09K 11/7774 313/484 |
| 2010/0327306 A1 | 12/2010 | Van Der Burgt et al. | |
| 2011/0128466 A1* | 6/2011 | Ishii | C09K 11/7734 349/61 |
| 2011/0204389 A1* | 8/2011 | Kasakura | C09K 11/0883 257/88 |
| 2013/0020930 A1 | 1/2013 | Li et al. | |
| 2013/0063926 A1 | 3/2013 | Winkler et al. | |
| 2013/0241394 A1* | 9/2013 | Nakagawa | C09K 11/7734 313/503 |
| 2014/0362885 A1* | 12/2014 | Sakuta | H01L 33/50 372/44.01 |
| 2015/0014725 A1* | 1/2015 | Hong | C09K 11/7721 257/98 |
| 2015/0334789 A1* | 11/2015 | van de Ven | H05B 33/02 313/498 |
| 2016/0149095 A1 | 5/2016 | Onuma et al. | |
| 2016/0276549 A1* | 9/2016 | Yamashita | H05B 37/02 |

FOREIGN PATENT DOCUMENTS

| | | | |
|---|---|---|---|
| JP | 2005285800 | 10/2005 | |
| JP | 2007-103512 | 4/2007 | |
| JP | 2008-506246 | 2/2008 | |
| JP | 2008166782 | 7/2008 | |
| JP | 2009188274 | 8/2009 | |
| JP | 2009-289957 | 12/2009 | |
| JP | 2011029497 | 2/2011 | |
| JP | 2011-514667 | 5/2011 | |
| JP | WO 2013147195 A1 * | 10/2013 | ............. H01L 33/44 |
| JP | 2014-060283 | 4/2014 | |
| JP | 201460283 | 4/2014 | |
| KR | 10-2010-0132968 | 12/2010 | |
| KR | 10-2011-0018391 | 2/2011 | |
| WO | 2009/114390 | 9/2009 | |
| WO | 2009/144922 | 12/2009 | |
| WO | 2014/014079 | 1/2014 | |
| WO | 2014/068440 | 5/2014 | |
| WO | 2014/104155 | 7/2014 | |
| WO | 2014/203841 | 12/2014 | |

OTHER PUBLICATIONS

Written Opinion dated Feb. 26, 2016, in PCT/KR2015/010590.
The Extended European Search Reported dated Apr. 24, 2018 in European Patent Application No. 15849447.6.
Extended European Search Report dated Aug. 21, 2019, issued in the European Patent Application No. 19175632.9.

* cited by examiner

LIGHT EMITTING DEVICE

CROSS-REFERENCE TO RELATED APPLICATION

This application is the National Stage Entry of International Application No. PCT/KR2015/010590, filed on Oct. 7, 2015, and claims priority from Korean Patent Application No. 10-2014-0136095, filed on Oct. 8, 2014, and Koran Patent Application No. 10-2015-0008212, filed on Jan. 16, 2015, and Korean Patent Application No. 10-2015-0008213, filed on Jan. 16, 2015, each of which are incorporated herein by reference for all purposes as if fully set forth herein.

BACKGROUND

Field

Exemplary embodiments of the present disclosure relate to a light emitting device. More particularly, exemplary embodiments of the present disclosure relate to a light emitting device which has improved properties in terms of reliability, color rendition, and luminous intensity.

Discussion of the Background

A light emitting diode (LED) package is a compound semiconductor having a semiconductor p-n junction and emits light through recombination of minority carriers (electrons or holes). A light emitting device including light emitting diodes has low power consumption and long life span and can be miniaturized.

A light emitting device can realize white light using a phosphor which is a wavelength conversion means. That is, white light can be realized by placing a phosphor on a light emitting diode chip such that a fraction of light primarily emitted from a light emitting diode chip can be mixed with wavelength-converted light secondarily emitted from the phosphor. Such white light emitting devices are cheap and simple in principle and structure and thus are widely used.

Specifically, white light may be obtained by applying a phosphor capable of emitting yellow-green or yellow light by absorbing a fraction of blue light as excitation light on a blue light emitting diode chip. Korean Patent Publication No. 10-2004-0032456 discloses a light emitting diode which includes a blue light emitting diode chip and phosphors attached to the blue light emitting diode chip and emitting yellow-green or yellow light using a fraction of light as an excitation source, thereby emitting white light through combination of the blue light from the light emitting diode with the yellow-green or yellow light from the phosphors.

However, since such a white light emitting device utilizes emission of yellow phosphors, light from the light emitting device has a spectrum outside the green and red regions, thereby causing reduction in color rendition. In particular, when used as a backlight unit, the white light emitting device has difficulty in realizing a color close to a natural color due to low color purity of light having passed through a color filter.

In order to overcome these problems, there has been proposed a light emitting diode fabricated using a blue light emitting diode chip and phosphors emitting blue light and green light using blue light as excitation light. Such a light emitting diode can realize white light having high color rendition by mixing the green light and red light from the phosphors excited by the blue light. When such a white light emitting diode is used as a backlight unit, light from the white light emitting diode can have relatively high color purity even after passage through a color filter, thereby realizing images closer to natural colors. However, the light emitting diode using the blue light emitting diode chip has relatively high intensity of blue light and thus can cause various side effects to the human body, such as sleep disorders, when used as illumination. For example, use of the light emitting diode can cause inhibition of melatonin, thereby affecting sleep patterns. For example, there is a high possibility that sleep disorders may occur.

In order to realize white light, an ultraviolet light emitting diode chip may be used instead of a blue light emitting diode chip. A light emitting device using an ultraviolet light emitting diode chip can realize high color rendition, allows easy conversion of the color temperature according to combination of phosphors, and can have excellent yield. However, the ultraviolet light emitting diode chip emits light at a wavelength having relatively high energy and thus can cause degradation or cracking of an encapsulant and discoloration of a plated lead frame. Thus, the light emitting device using the ultraviolet light emitting diode chip can exhibit poor reliability.

Therefore, there is a need for a light emitting device which can overcome the above problems.

R9 is an indicator of strong redness, which is important in areas related to skin color, artwork, clothing, and food. For a light emitting device using a light emitting diode chip emitting near-violet light, a CASN phosphor having a long peak wavelength is used to provide a CRI of 90 or higher and an R9 of 50 or higher. However, when using a CASN-based long wavelength phosphor, there is a problem in that a light emitting device can be reduced in luminous intensity by 4% or more despite having increased R9.

SUMMARY

Exemplary embodiments of the present disclosure provide a light emitting device which has improved reliability and color rendition.

Exemplary embodiments of the present disclosure provide a light emitting device which has improved luminous efficacy and luminous intensity.

Exemplary embodiments of the present disclosure provide a light emitting device which has increased CRI and R9 values.

In accordance with one aspect of the present disclosure, a light emitting device includes: a housing; a light emitting diode chip disposed in the housing; a wavelength converter disposed on the light emitting diode chip; a first phosphor distributed in the wavelength converter and emitting light having a peak wavelength in the cyan wavelength band; and a second phosphor distributed in the wavelength converter and emitting light having a peak wavelength in the red wavelength band, wherein light emitted from the light emitting diode chip has a peak wavelength of 415 nm to 430 nm.

The first phosphor may include at least one of LuAG, YAG, nitride, and silicate phosphors.

The second phosphor may include at least one of CASN, CASON, and SCASN phosphors.

The light emitted from the first phosphor may have a peak wavelength of 500 nm to 540 nm and the light emitted from the second phosphor may have a peak wavelength of 600 nm to 650 nm.

The light emitting device may further include: a third phosphor distributed in the wavelength converter and emitting light having a peak wavelength in the blue wavelength band, wherein the third phosphor may include at least one of SBCA, BAM, silicate, and nitride phosphors.

The light emitted from the third phosphor may have a peak wavelength of 450 nm to 480 nm.

The light emitting device may emit white light generated by combination of light from the light emitting diode chip with light from the first phosphor and light from the second phosphor, wherein the white light may have a CRI of 85 or higher.

The wavelength converter may include at least one of silicone, epoxy, PMMA, PE, and PS.

The light emitting device may further include a buffer portion disposed between the wavelength converter and the light emitting diode chip, wherein the buffer portion may have lower hardness than the wavelength converter.

The wavelength converter may include: a first wavelength converter covering the light emitting diode chip; and a second wavelength converter covering the first wavelength converter, wherein the first wavelength converter may contain the second phosphor and the second wavelength converter may contain the first phosphor.

The housing may include a reflector reflecting the light emitted from the light emitting diode chip.

The housing may further include a barrier reflector covering the reflector.

In accordance with another aspect of the present disclosure, a light emitting device includes: a first phosphor excited by light from the light emitting diode chip to emit light having a peak wavelength in the cyan wavelength band; and a second phosphor excited by light from the light emitting diode chip to emit light having a peak wavelength in the red wavelength band, wherein the light emitted from the light emitting diode chip has a peak wavelength of 415 nm to 430 nm; the light emitting device emits white light generated by combination of the light from the light emitting diode chip with the light from the first phosphor and the light from the second phosphor; and 40% or more of an optical spectrum of the white light is distributed in a wavelength range of 500 nm to 600 nm.

The light emitted from the first phosphor may have a peak wavelength of 500 nm to 540 nm and the light emitted from the second phosphor may have a peak wavelength of 600 nm to 650 nm.

The white light may have a CRI of 85 or higher.

The first phosphor may include at least one of LuAG, YAG, nitride, and silicate phosphors.

The second phosphor may include at least one of CASN, CASON, and SCASN phosphors.

The light emitting device may further include: a third phosphor excited by the light from the light emitting diode chip to emit light having a peak wavelength in the blue wavelength band, wherein the third phosphor may include at least one of SBCA, BAM, silicate, and nitride phosphors.

The light emitted from the third phosphor may have a peak wavelength of 450 nm to 480 nm.

In accordance with a further aspect of the present disclosure, a white light emitting device includes: a light emitting diode emitting light having a peak wavelength of 415 nm to 435 nm; and a wavelength converter disposed on the light emitting diode, wherein the wavelength converter includes: a first red phosphor and a second red phosphor each emitting light having a peak wavelength in the red wavelength band; a green phosphor emitting light having a peak wavelength in the green wavelength band; and a cyan phosphor emitting light having a peak wavelength in the cyan wavelength band; the first red phosphor and the second red phosphor are formed of different materials; and light emitted from the light emitting device has a CRI of 90 or higher. Thus, the white light emitting device can have excellent properties in terms of color rendition and luminous intensity.

The first red phosphor may include a phosphor represented by $A_2MF_6$:Mn, wherein A is any one of selected from the group consisting of Li, Na, K, Rb, Ce, and $NH_4$, and M is any one of selected from the group consisting of Si, Ti, Nb, and Ta.

The green phosphor may include a silicate phosphor.

The silicate phosphor may include a phosphor represented by $(Ba,Sr,Ca)_2SiO_4$:EU.

The second red phosphor may include a CASN phosphor.

The CASN phosphor may include a phosphor represented by $(Sr,Ca)AlSiN_3$:EU or $CaAlSiN_3$:EU.

The cyan phosphor may include an LuAG phosphor.

The LuAG phosphor may include a phosphor represented by $Lu_3Al_5O_{12}$:Ce or $Lu_3(Al,X)_5O_{12}$:Ce (where X is a group III element other than Al, and Al is partially substituted with a group III element other than Al).

A weight ratio of the cyan phosphor to the green phosphor may be 8 to 9.9:0.1 to 2 and a weight ratio of the second red phosphor to the first red phosphor may be 2.5 to 5:7.5 to 5.

The first red phosphor and the second red phosphor may emit light having a wavelength of 600 nm to 630 nm, the green phosphor may emit light having a wavelength of 520 nm to 550 nm, and the cyan phosphor may emit light having a wavelength of 490 nm to 550 nm.

The wavelength converter may cover at least part of the light emitting diode.

In accordance with yet another embodiment of the present disclosure, a white light emitting device includes: a light emitting diode emitting light having a peak wavelength of 415 nm to 435 nm; and a wavelength converter disposed on the light emitting diode, wherein the wavelength converter includes: a first red phosphor represented by $A_2MF_6$:Mn; a second red phosphor represented by $(Sr,Ca)AlSiN_3$:EU or $CaAlSiN_3$:EU; a green phosphor represented by $(Ba,Sr,Ca)_2SiO_4$:EU; and a cyan phosphor represented by $Lu_3Al_5O_{12}$:Ce or $Lu_3(Al,X)_5O_{12}$:Ce (where Al is partially replaced by a group III element other than Al), and a weight ratio of the cyan phosphor to the green phosphor is 8 to 9.9:0.1 to 2 and a weight ratio of the second red phosphor to the first red phosphor is 2.5 to 5:7.5 to 5, (where A is any one selected from the group consisting of Li, Na, K, Rb, Ce, and $NH_4$, M is any one selected from the group consisting of Si, Ti, Nb, and Ta, and X is a group III element other than Al). Thus, the white light emitting device can have excellent properties in terms of color rendition and luminous intensity.

In accordance with yet another aspect of the present disclosure, a white light emitting device includes: a light emitting diode emitting light having a peak wavelength of 415 nm to 435 nm; and a wavelength converter disposed on the light emitting diode, wherein the wavelength converter includes a red phosphor emitting light having a peak wavelength in the red wavelength band, a green phosphor emitting light having a peak wavelength in the green wavelength band, and a cyan phosphor emitting light having a peak wavelength in the cyan wavelength band; the light emitted from the light emitting device has a CRI of 90 or higher; and the light emitting device has a luminous intensity variation rate of higher than 100%, as calculated according to Equation 1:

$$\text{Luminous intensity variation rate } (\%) = (F_1/F_0) \times 100. \quad \text{[Equation 1]}$$

$F_1$: Luminous intensity (unit: lm) of light emitted from the light emitting device $F_0$: luminous intensity (unit: lm) of light emitted from a light emitting device including a wavelength converter only including a CASN phosphor represented by $(Sr,Ca)AlSiN_3$:EU and an LuAG phosphor represented by $Lu_3Al_5O_{12}$:Ce or $Lu_3(Al,X)_5O_{12}$:Ce (where X is a group III element other than Al, and Al is partially substituted with a group III element other than Al) as phosphors.

In accordance with yet another aspect of the present disclosure, a white light emitting device includes: a light emitting diode emitting light having a peak wavelength of 415 nm to 435 nm; and a wavelength converter disposed on the light emitting diode, wherein the wavelength converter includes a first red phosphor and a second red phosphor each emitting light having a peak wavelength in the red wavelength band and a cyan phosphor emitting light having a peak wavelength in the cyan wavelength band; the first red phosphor and the second red phosphor are formed of different materials; and light emitted from the light emitting device has a CRI of 90 or higher and an R9 of 50 or higher. Thus, the white light emitting device can have excellent properties in terms of color rendition and luminous intensity.

The first red phosphor may include a phosphor represented by $A_2MF_6$:Mn, wherein A is any one selected from the group consisting of Li, Na, K, Rb, Ce, and NH4, and M is any one selected from the group consisting of Si, Ti, Nb, and Ta.

The second red phosphor may include a CASN phosphor.

The CASN phosphor may include a phosphor represented by $(Sr,Ca)AlSiN_3$:EU.

The cyan phosphor may include an LuAG phosphor.

The LuAG phosphor may include a phosphor represented by $Lu_3Al_5O_{12}$:Ce or $Lu_3(Al,X)_5O_{12}$:Ce (where X is a group III element other than Al, and Al is partially substituted with a group III element other than Al).

A weight ratio of the second red phosphor to the first red phosphor may be 0.5 to 4:6.5 to 9.5. Thus, the white light emitting device can have excellent properties in terms of color rendition and luminous intensity.

The first red phosphor and the second red phosphor may emit light having a wavelength of 600 nm to 660 nm and the cyan phosphor may emit light having a wavelength of 490 nm to 550 nm.

The wavelength converter may cover at least part of the light emitting diode.

In accordance with yet another aspect of the present disclosure, there is provided a white light emitting device, including: a light emitting diode emitting light having a peak wavelength of 415 nm to 435 nm; and a wavelength converter disposed on the light emitting diode, wherein the wavelength converter comprises: a first red phosphor represented by $A_2MF_6$:Mn; a second red phosphor represented by $(Sr,Ca)AlSiN_3$:EU; and a cyan phosphor represented by $Lu_3Al_5O_{12}$:Ce or $Lu_3(Al,X)_5O_{12}$:Ce (where Al is partially substituted with a group III element other than Al), and a weight ratio of the second red phosphor to the first red phosphor is 0.5 to 4:6.5 to 9.5 (where A is any one selected from the group consisting of Li, Na, K, Rb, Ce, and $NH_4$, M is any one selected from the group consisting of Si, Ti, Nb, and Ta, and X is a group III element other than Al).

In accordance with yet another aspect of the present disclosure, a white light emitting device includes:
a light emitting diode emitting light having a peak wavelength of 415 nm to 435 nm; and
a wavelength converter disposed on the light emitting diode,
wherein the wavelength converter includes a red phosphor emitting light having a peak wavelength in the red wavelength band and a cyan phosphor emitting light having a peak wavelength in the cyan wavelength band;

the light emitted from the light emitting device has a CRI of 90 or higher and an R9 of 50 or higher; and the light emitting device has a luminous intensity variation rate of higher than 98.8%, as calculated according to Equation 1:

Luminous intensity variation rate (%)=$(F1/F0) \times 100$.  [Equation 1]

$F_1$: Luminous intensity (unit: lm) of light emitted from the light emitting device $F_0$: luminous intensity (unit: lm) of light emitted from a light emitting device including a wavelength converter only including a CASN phosphor represented by $(Sr,Ca)AlSiN_3$:EU and an LuAG phosphor represented by $Lu_3Al_5O_{12}$:Ce or $Lu_3(Al,X)_5O_{12}$:Ce (where X is a group III element other than Al, and Al is partially substituted with a group III element other than Al) as phosphors.

Exemplary embodiments of the present disclosure provide a light emitting device, which can emit light having an optical spectrum concentrated in a wavelength range having high luminous efficacy, thereby improving luminous efficacy and luminous intensity. In addition, a light emitting diode chip having a peak wavelength in the visible range is used in the light emitting device, thereby improving reliability of the light emitting device while enhancing color rendition of white light emitted from the light emitting device.

Exemplary embodiments of the present disclosure provide a light emitting device emitting light having high color rendition and high luminous intensity.

Exemplary embodiments of the present disclosure provide a light emitting device emitting light having high CRI and R9 values and high luminous intensity.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Hereinafter, exemplary embodiments of the present disclosure will be described in detail with reference to the accompanying drawings. It should be understood that the present disclosure is not limited to the following embodiments and may be embodied in different ways, and that the embodiments are provided for complete disclosure and thorough understanding of the present disclosure by those skilled in the art. In addition, it should be noted that the drawings are not to precise scale and may be exaggerated in thickness of lines or size of components for descriptive convenience and clarity only. It will be understood that when an element such as a layer, film, region or substrate is referred to as being placed "above (or below)" or "on (or under)" another element, it can be directly placed on the other element, or intervening layer(s) may also be present. Further, like components will be denoted by like reference numerals throughout the specification and the accompanying drawings.

Figure 1:
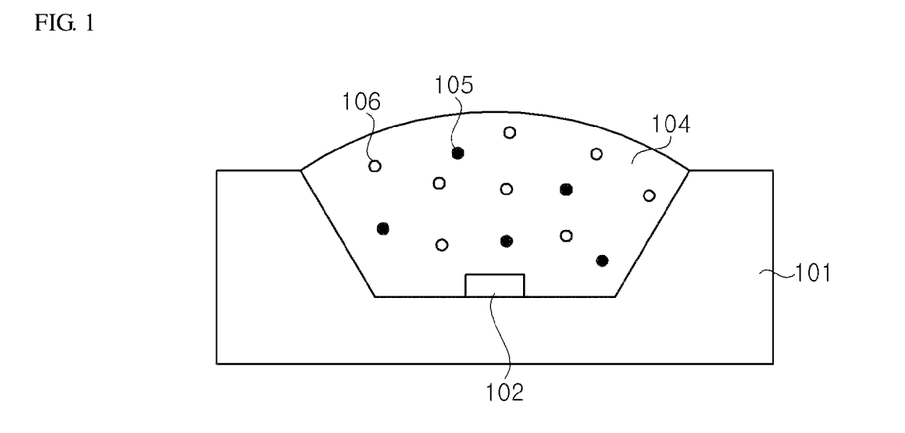
FIG. 1 is a schematic sectional view of a light emitting device according to one exemplary embodiment of the present disclosure.

FIG. 1 is a schematic sectional view of a light emitting device according to one exemplary embodiment of the present disclosure.

Referring to FIG. 1, a light emitting device according to this exemplary embodiment includes a housing 101, a light emitting diode chip 102, a wavelength converter 104, a first phosphor 105, and a second phosphor 106.

In this exemplary embodiment, the light emitting diode chip 102, the wavelength converter 104, the first phosphor 105, and the second phosphor 106 may be disposed in the housing 101. The housing 101 may be provided with lead terminals (not shown) for inputting power to the light emitting diode chip 102. The housing 101 may include a mounting region for mounting the light emitting diode chip 102, and the light emitting diode chip 102 may be mounted on the mounting region through a paste or the like. The first and second phosphors 105, 106 may be distributed within the wavelength converter 104, and the wavelength converter 104 may cover at least part of the light emitting diode chip 102.

The housing 101 may be formed of general plastics including polymers and the like, acrylonitrile butadiene styrene (ABS), liquid crystalline polymers (LCPs), polyamide (PA), polyphenylene sulfide (IPS), thermoplastic elastomers (TPEs), metals, or ceramics. However, a material for the housing 101 is not limited thereto. In addition, the housing 101 may have an inclined inner wall for reflection of light beams emitted from the light emitting diode chip 102 and the first and second phosphors 105, 106.

The wavelength converter 104 may be formed of a material including at least one of silicone, epoxy, poly (methyl methacrylate) (PMMA), polyethylene (PE), and polystyrene (PS). The wavelength converter 104 may be formed by injection molding using a mixture of the above material and the first and second phosphors 105, 106. Alternatively, the wavelength converter 104 may be formed by fabricating a molded product using a separate mold, followed by pressing or heat-treating the molded product. The wavelength converter 104 may be formed in various shapes such as a convex lens shape, a flat plate shape (not shown), and a shape having a surface embossed in a predetermined pattern. Although the wavelength converter 104 is shown as having a convex lens shape herein, it should be understood that the shape of the wavelength converter 104 is not limited thereto.

In this exemplary embodiment, the light emitting diode chip 102 may emit light having a peak wavelength of 415 nm to 430 nm. In addition, the light emitting diode chip 102 may emit light having a full width at half maximum (FWHM) of 40 nm or less at the peak wavelength.

Although the light emitting device is shown as including one light emitting diode chip 102 herein, it should be understood that other implementations are also possible. The light emitting device according to the exemplary embodiment may further include at least one light emitting diode chip that emits light having the same peak wavelength as the light emitting diode chip 102 or light having a different peak wavelength.

The first phosphor 105 and the second phosphor 106 may be excited by the light emitted from the light emitting diode chip 102. The first phosphor 105 may be excited to emit light having a peak wavelength in the cyan wavelength band, and the second phosphor 106 may be excited to emit light having a peak wavelength in the red wavelength band.

The peak wavelength of the light emitted from the first phosphor 105 may be in the range of 500 nm to 540 nm. The first phosphor 105 may include at least one of LuAG, YAG, beta-SiAlON, nitride, and silicate phosphors, without being limited thereto. As the first phosphor 105, any phosphor may be used so long as the phosphor can be excited by light from the light emitting diode chip 102 to emit light having a peak wavelength in the cyan wavelength band within the range of 500 nm to 540 nm. When the first phosphor 105 includes an LuAG phosphor, the LuAG phosphor may include a phosphor represented by $Lu_xAl_yO_z$: Ce or $Lu_x(Al,Ga)_yO_z$:Ce.

The peak wavelength of the light emitted from the second phosphor 106 may be in the range of 600 nm to 650 nm. The second phosphor 106 may be a nitride phosphor represented by CASN, CASON, and SCASN, without being limited thereto.

Electromagnetic radiation visible to the human eye has a wavelength of 380 nm to 760 nm, and the human eye finds green light at 555 nm to be brightest. Thus, the human eye perceives light having a wavelength longer than or shorter than 555 nm to as being less bright. This may be expressed as a value obtained by dividing luminous flux a (unit: lm) of wavelength λ, by radiant flux ρ (unit: W), that is, Fλ/ρ (lm/W), and luminous efficacy of green light having a wavelength of 555 nm is referred to as maximum luminous efficacy. Thus, in order to increase luminous intensity of white light from the light emitting device perceived by the human eye, that is, luminous efficacy, the light emitting device is required to emit light having an optical spectrum concentrated around 555 nm.

In this exemplary embodiment, the light emitting diode chip 102 may emit light having a peak wavelength of 415 nm to 430 nm, the first phosphor 105 is excited by light from the light emitting diode chip 102 to emit light having a peak wavelength of 500 nm to 540 nm, and the second phosphor 106 is excited by light from the light emitting diode chip 102 to emit light having a peak wavelength of 600 nm to 650 nm. Accordingly, white light emitted from the light emitting device has an optical spectrum concentrated around light having the maximum luminous efficacy, that is, green light having a wavelength of 555 nm. More specifically, 40% or more of an optical spectrum of the white light emitted from the light emitting diode according to this exemplary embodiment may be distributed within the wavelength range of 500 nm to 600 nm around 555 nm.

A typical light emitting device using a blue light-emitting diode chip uses phosphors that emit light having a relatively long peak wavelength in the red wavelength band. Thus, it is difficult for such a typical light emitting device to emit white light having an optical spectrum concentrated around light having a wavelength of 555 nm. The light emitting device according to this exemplary embodiment can emit white light having a high luminous efficacy and luminous intensity, as compared with typical light emitting devices. Further, since the light emitting device according to this exemplary embodiment does not include an ultraviolet light emitting diode chip, it is possible to prevent package components from being damaged due to ultraviolet light emitted from the ultraviolet light emitting diode chip. Light emitted from the light emitting device according to this exemplary embodiment may have a color rendering index (CRI) of 85 or higher. Specifically, the light emitted from the light emitting device according to this exemplary embodiment may have a CRI of 90 or higher.

Experimental Example 1

In order to confirm that the light emitting device according to this exemplary embodiment can provide enhanced luminous efficacy and luminous intensity, a test was conducted as follows: First, for comparison, two light emitting device samples were prepared. Sample 1 is a typical light emitting device and includes a light emitting diode chip emitting light having a peak wavelength of 450 nm, a cyan phosphor represented by $Lu_3Al_5O_{12}$:Ce, and a red phosphor represented by $CaAlSiN_3$:Eu. Sample 2 is a light emitting device according to the embodiment of the present disclosure and includes a light emitting diode chip emitting light having a peak wavelength of 425 nm, a cyan phosphor (first phosphor) represented by $Lu_3(Al,Ga)_5O_{12}$:Ce, and a red phosphor (second phosphor) represented by $(Sr,Ca)AlSiN_3$:Eu. Current applied to the two light emitting device samples was 100 mA and testing was carried out under the same conditions.

As a result of analyzing white light emitted from Sample 1 and Sample 2, Sample 1 exhibited a luminous efficacy of 109.5 lm/W and Sample 2 exhibited a luminous efficacy of 115.1 lm/W. In addition, with the same color coordinates, Sample 1 exhibited a luminous intensity (flux) of 33.35 lm, and Sample 2 exhibited a luminous intensity (flux) of 36.08 lm. Further, Sample 1 exhibited a CRI of 90, and Sample 2 exhibited a CRI of 92.5. In other words, it could be seen that the light emitting device according to the exemplary embodiments of the present disclosure was improved in luminous efficacy, luminous intensity, and CRI, as compared with the typical light emitting device. Particularly, the luminous efficacy and the luminous intensity (flux) of the light emitting device according to the exemplary embodiment of the present disclosure was improved by 5.1% and 8.2%, respectively, as compared with those of the typical light emitting device.

Figure 2:
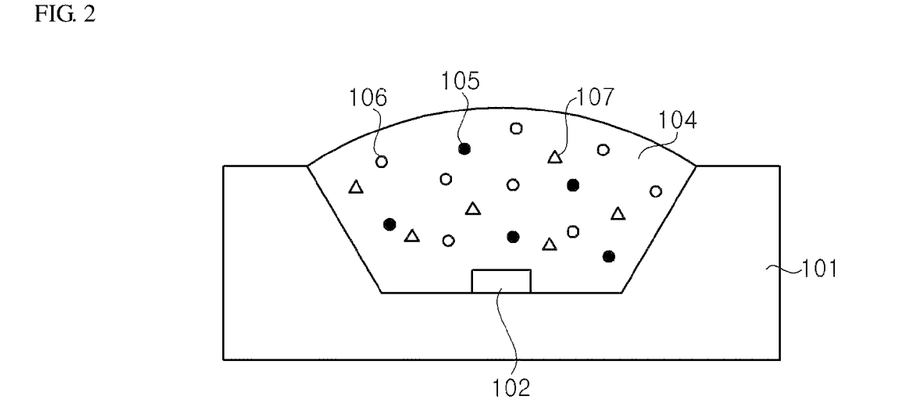
FIG. 2 is a schematic sectional view of a light emitting device according to another exemplary embodiment of the present disclosure.

FIG. 2 is a schematic sectional view of a light emitting device according to another exemplary embodiment of the present disclosure.

Referring to FIG. 2, the light emitting device according to this exemplary embodiment includes a housing 101, a light emitting diode chip 102, a wavelength converter 104, a first phosphor 105, a second phosphor 106, and a third phosphor 107. The light emitting device according to this exemplary embodiment is substantially the same as the light emitting device according to the above exemplary embodiment except for the third phosphor 107. Thus, repeated descriptions of the same components will be omitted.

Referring to FIG. 2, the light emitting device according to this exemplary embodiment includes the third phosphor. The third phosphor 107 may emit light having a peak wavelength in the blue wavelength band. Specifically, the third phosphor 107 may be excited by light emitted from the light emitting diode chip 102 to emit light having a peak wavelength of 450 nm to 480 nm. The third phosphor 107 may include at least one of SBCA, BAM (Ba—Al—Mg), silicate, and nitride phosphors, without being limited thereto. Any phosphor may be used as the third phosphor 107 so long as the phosphor can be excited by light having a peak wavelength of 415 nm to 430 nm from the light emitting diode chip 102 to emit light having a peak wavelength of 450 nm to 480 nm.

Experimental Example 2

In order to confirm that the light emitting device according to this exemplary embodiment, which further includes the third phosphor 107, can provide enhanced luminous efficacy and luminous intensity, a test was conducted as follows: Sample 1 of Experimental example 1 was used as a typical light emitting device sample. Sample 3 was prepared as a sample of the light emitting device according to this exemplary embodiment. Here, Sample 3 was a light emitting device including a light emitting diode chip having a peak wavelength of 425 nm, a cyan phosphor (first phosphor) represented by $Lu_3(Al,Ga)_5O_{12}$:Ce, a red phosphor (second phosphor) represented by $(Sr,Ca)AlSiN_3$:Eu, and a blue phosphor (third phosphor) represented by $(Sr,Ba)_{10}(PO_4)_6Cl_2$:Eu. The current applied to the two light emitting device samples was 100 mA, and the test was carried out under the same conditions.

Figure 7:
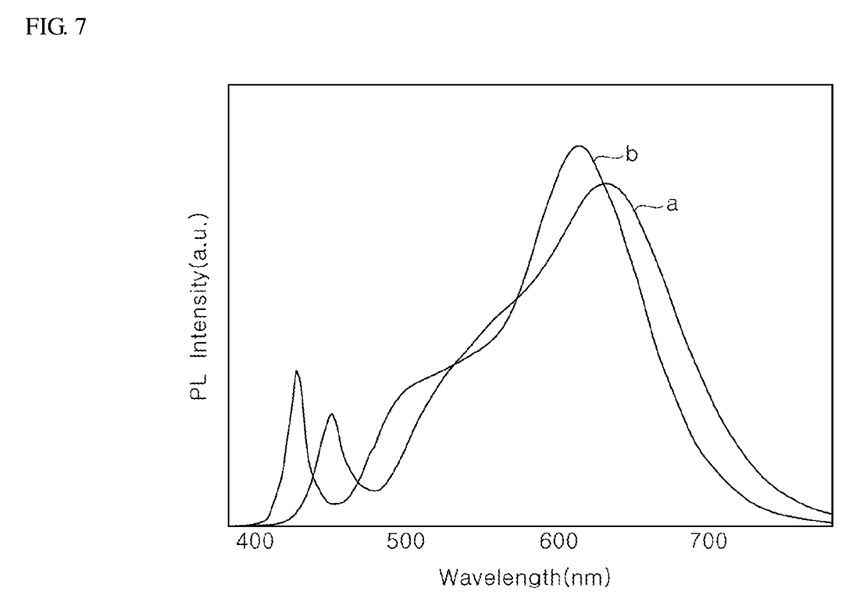
FIG. 7 is a graph comparing optical spectra of a light emitting device according to the exemplary embodiment of the present disclosure and a typical light emitting device.

As a result of analyzing white light emitted from Sample 1 and Sample 3, Sample 1 exhibited a luminous efficacy of 109.5 lm/W, and Sample 2 exhibited a luminous efficacy of 116.5 lm/W. In addition, with the same color coordinates, Sample 1 exhibited a luminous intensity (flux) of 33.35 lm and Sample 2 exhibited a luminous intensity (flux) of 36.57 lm. Further, Sample 1 exhibited a CRI of 90 and Sample 2 exhibited a CRI of 92. Thus, it could be seen that the light emitting device according to this exemplary embodiment was improved in terms of luminous efficacy, luminous intensity, and CRI, as compared with the typical light emitting device. Specifically, the luminous efficacy and luminous intensity (flux) of the light emitting device according to this exemplary embodiment was improved by 6.4% and 9.7%, respectively, as compared with those of the typical light emitting device. FIG. 7 is a graph comparing optical spectra of the light emitting device according to this exemplary embodiment and the typical light emitting device. Referring to FIG. 7, Line a represents the optical spectrum of Sample 1, which is the typical light emitting device sample, and Line b represents the optical spectrum of Sample 3, which is the light emitting device according to this exemplary embodiment. As shown in the graph, it can be seen that the optical spectrum of Sample 3 is more concentrated around 555 nm, which is a wavelength exhibiting the maximum luminous efficacy, than that of the typical light emitting device.

Figure 3:
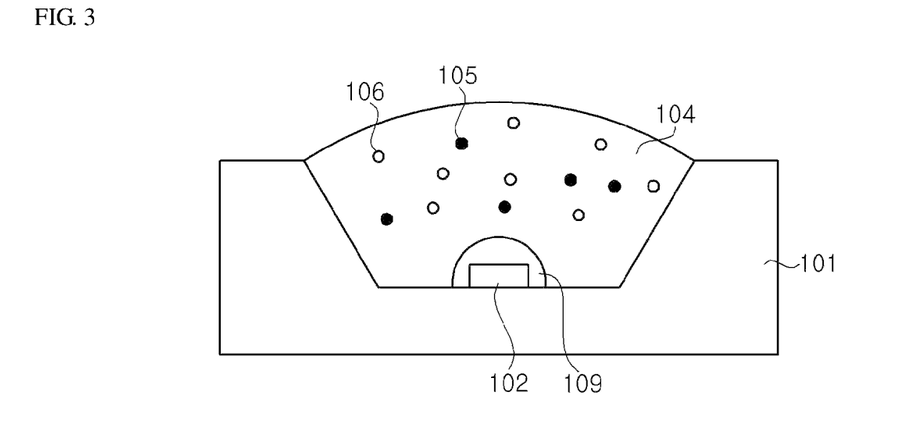
FIG. 3 is a schematic sectional view of a light emitting device according to a further exemplary embodiment of the present disclosure.

FIG. 3 is a schematic sectional view of a light emitting device according to a further exemplary embodiment of the present disclosure.

Referring to FIG. 3, the light emitting device according to this exemplary embodiment includes a housing 101, a light emitting diode chip 102, a wavelength converter 104, a first phosphor 105, a second phosphor, and a buffer portion 109. The light emitting device according to this exemplary embodiment is substantially similar to the light emitting device according to the above embodiment except for the buffer portion 109. Thus, repeated descriptions of the same components will be omitted.

The buffer portion 109 may be disposed between the light emitting diode chip 102 and the wavelength converter 104. The buffer portion may be formed of a material including at least one of silicone, epoxy, poly(methyl methacrylate) (PMMA), polyethylene (PE), and polystyrene (PS). The buffer portion 109 may have lower hardness than the wavelength converter 104. The buffer portion 109 serves to prevent thermal stress of the wavelength converter 104 due to heat generated in the light emitting diode chip 102. Although the buffer portion 109 is shown as disposed around the light emitting diode chip 102, it should be understood that the buffer portion may be disposed over a wide area to adjoin right and left walls of the housing 101.

Figure 4:
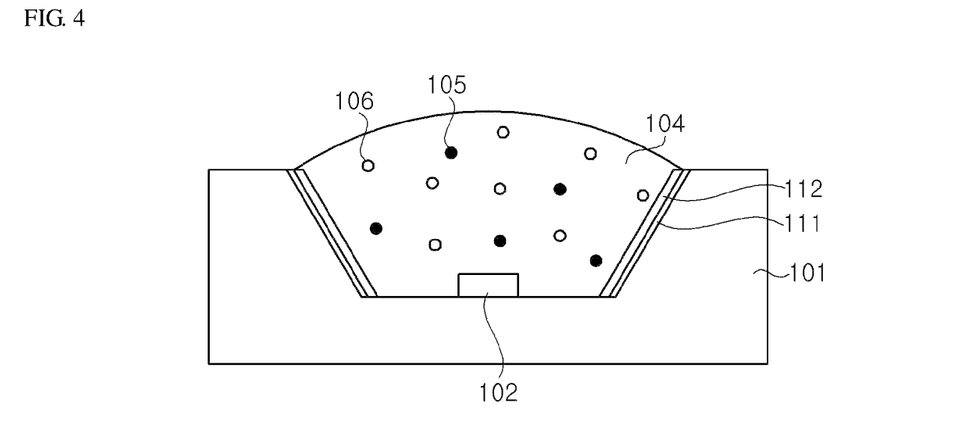
FIG. 4 is a schematic sectional view of a light emitting device according to yet another exemplary embodiment of the present disclosure.

FIG. 4 is a schematic sectional view of a light emitting device according to yet another exemplary embodiment of the present disclosure.

Referring to FIG. 4, the light emitting device according to this exemplary embodiment may include a housing 101, a light emitting diode chip 102, a wavelength converter 104, a first phosphor 105, a second phosphor 106, a reflector 111, and a barrier reflector 112. The light emitting device according to this exemplary embodiment is substantially similar to the light emitting device according to the above embodiment except for the reflector 111 and the barrier reflector 112. Thus, repeated descriptions of the same components will be omitted.

The reflector 111 may be disposed on a side surface of the housing away from the light emitting diode chip 102. The reflector 111 serves to maximize reflection of light emitted from the light emitting diode chip 102 and the first and second phosphors 105, 106, thereby increasing luminous efficiency. The reflector 111 may be any one of a reflective coating film and a reflective coating material layer. The reflector 111 may be formed of at least one of inorganic materials, organic materials, metals, and metal oxides having excellent heat resistance and light resistance. For example, the reflector 111 may include a metal or metal oxide having high reflectance, such as aluminum (Al), silver (Ag), gold (Au), and titanium dioxide ($TiO_2$). The reflector 111 may be formed by depositing or coating the metal or the metal oxide on the housing 101 or by printing a metal ink on the housing. Alternatively, the reflector 111 may be formed by attaching a reflective film or a reflective sheet to the housing 101.

The barrier reflector 112 may cover the reflector 111. The barrier reflector 112 serves to prevent degradation of the reflector 111 due to heat emitted from the light emitting diode chip 102. The barrier reflector 112 may be formed of an inorganic material or a metal having high light resistance and reflectivity.

Figure 5:
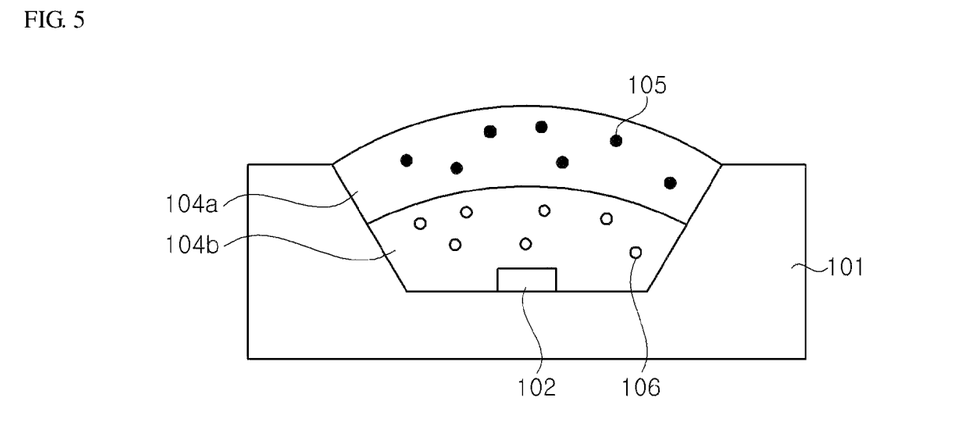
FIG. 5 is a schematic sectional view of a light emitting device according to yet another exemplary embodiment of the present disclosure.

FIG. 5 is a schematic sectional view of a light emitting device according to yet another exemplary embodiment of the present disclosure.

Referring to FIG. 5, the light emitting device according to this exemplary embodiment includes a housing 101, a light emitting diode chip 102, a wavelength converter 104, a first phosphor 105, and a second phosphor 106, wherein the wavelength converter 104 may include a first wavelength converter 104b and a second wavelength converter 104a. The light emitting device according to this exemplary embodiment is substantially similar to the light emitting device according to the above embodiment except for the first wavelength converter 104b and the second wavelength converter 104a. Thus, repeated descriptions of the same components will be omitted.

The first wavelength converter 104b may cover the first and second light emitting diode chips 102, 103. The second wavelength converter 104a may cover the first wavelength converter 104b. The first wavelength converter 104b may be formed of a material having the same hardness as the second wavelength converter 104a, or may be formed of a material having a different hardness. In this exemplary embodiment, the first wavelength converter 104b may have lower hardness than the second wavelength converter 104a. In this case, like the buffer portion 109 in the aforementioned embodiment, the first wavelength converter can prevent thermal stress of the second wavelength converter due to heat generated in the light emitting diode chips 102, 103.

The first wavelength converter 104b may contain the second phosphor 106 that emits light having a peak wavelength in the red wavelength band. The second wavelength converter 104a may contain the first phosphor 105 that emits light having a peak wavelength in the cyan wavelength band. In this exemplary embodiment, phosphors emitting light at longer wavelengths are disposed on the lower side and phosphors emitting light at shorter wavelengths are disposed on the upper side, whereby the light emitting device can prevent cyan light emitted from the first phosphor 105 from being reabsorbed to cause light loss by the second phosphor 106.

Figure 6:
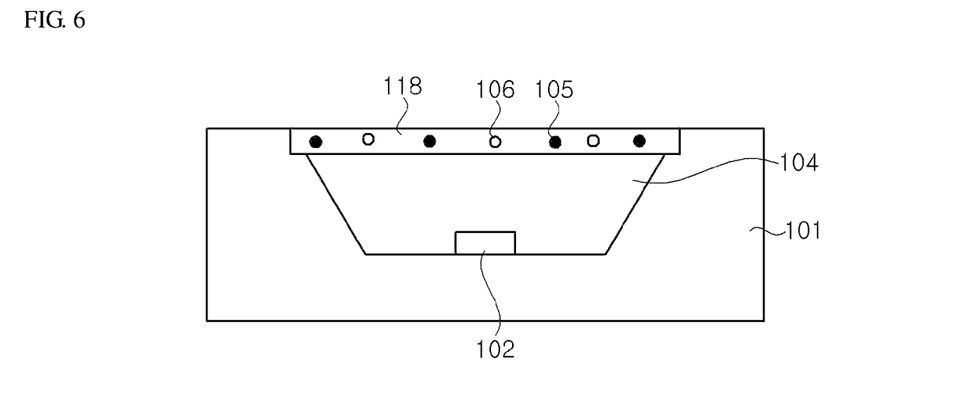
FIG. 6 is a schematic sectional view of a light emitting device according to yet another exemplary embodiment of the present disclosure.

FIG. 6 is a schematic sectional view of a light emitting device according to yet another exemplary embodiment of the present disclosure.

Referring to FIG. 6, the light emitting device according to this exemplary embodiment includes a housing 101, a light emitting diode chip 102, a wavelength converter 104, a first phosphor 105, a second phosphor 106, and a phosphor plate 118. The light emitting device according to this exemplary embodiment is substantially similar to the light emitting device according to the above embodiment except for the phosphor plate 118. Thus, repeated descriptions of the same components will be omitted.

The phosphor plate 118 is disposed on the wavelength converter 104 to be spaced apart from the light emitting diode chip 102 and may contain the first and second phosphors 105, 106. The phosphor plate 118 may be formed of the same material as the wavelength converter 104 according to the above exemplary embodiment or a material having high hardness.

Since the first and second phosphors 105, 106 are spaced apart from the light emitting diode chip 102, damage to the first and second phosphors 105, 106 and the phosphor plate 118 due to heat or light can be reduced. As a result, it is possible to improve reliability of the first and second phosphors 105, 106. Alternatively, an empty space may be formed between the phosphor plate 118 and the light emitting diode chip 102, instead of the wavelength converter 104.

Figure 8:
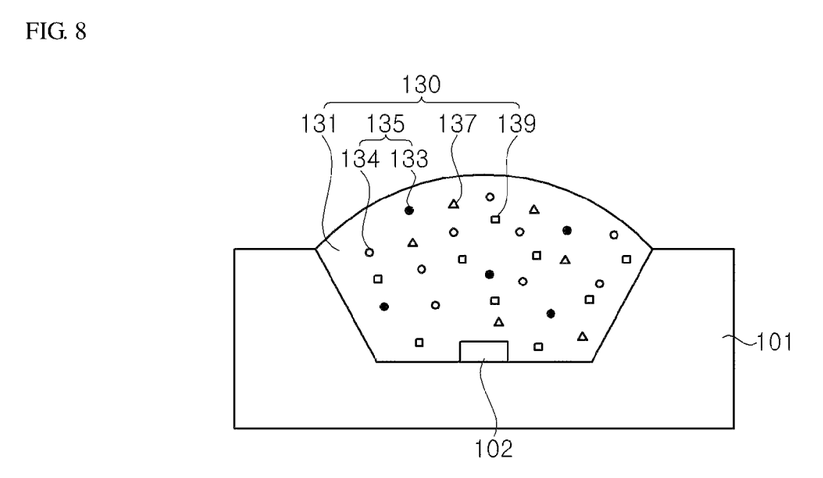
FIG. 8 is a schematic sectional view of a light emitting device according to yet another exemplary embodiment of the present disclosure.

FIG. 8 is a sectional view of a light emitting device according to yet another exemplary embodiment of the present disclosure.

Referring to FIG. 8, the light emitting device according to this exemplary embodiment includes a light emitting diode 102, a wavelength converter 130, and a housing 101.

In this exemplary embodiment, the light emitting diode 102 may be disposed on the housing 101. Here, the housing may be, for example, a base, as shown in the drawing.

The housing may include a cavity open upward, and the light emitting diode 102 may be mounted in the cavity. The cavity may have an inclined inner side surface such that light emitted from the light emitting diode 102 can be reflected from the side surface, thereby improving luminous efficiency of the light emitting device according to this exemplary embodiment. In addition, a reflective material may be further disposed on the inner side surface of the cavity.

When the base is formed as a housing, the housing may be formed of general plastics including polymers and the like, acrylonitrile butadiene styrene (ABS), liquid crystalline polymers (LCPs), polyamide (PA), polyphenylene sulfide (IPS), thermoplastic elastomers (TPEs), metals, or ceramics. However, it should be understood that other implementations are also possible.

In addition, the housing 101 may include at least two lead terminals and the light emitting diode 102 may be electrically connected to the lead terminals. Through the lead terminals, the light emitting device can be connected to an external power source. Alternatively, the light emitting diode 102 may be located on the lead terminals.

Further, the housing 101 may further include any known components capable of supporting the light emitting diode 102. For example, the housing 101 may include a PCB or a conductive or insulating substrate on which the light emitting diode 102 is mounted, such as a lead frame, and may include a heat sink or the like for dissipating heat generated from the light emitting diode 102.

The light emitting diode 102 may include an n-type semiconductor layer and a p-type semiconductor layer to emit light through recombination of holes and electrons. The light emitting diode 102 may be a horizontal, vertical, or flip chip-type light emitting diode, and the configuration and shape of the light emitting diode 102 are not particularly limited.

The light emitting diode 102 can emit light having a peak wavelength in the visible range, particularly, light having a peak wavelength of 415 nm to 435 nm. With the light emitting diode 102 that emits light having a peak wavelength in the above range, the light emitting device can prevent reduction in reliability and luminous efficiency due to use of an ultraviolet light emitting diode and can minimize light emission at about 450 nm, thereby minimizing harmfulness to the human body.

The wavelength converter 130 may be disposed on the light emitting diode 102 to cover at least part of the light emitting diode 102 or to encapsulate the light emitting diode 102. That is, the wavelength converter 130 may be positioned on a light emission path of the light emitting diode 102.

The wavelength converter 130 may include a support 131; and a red phosphor 135, green phosphor 137, and cyan phosphor 139 irregularly dispersed in the support 131.

The support 131 may be formed of any material capable of supporting the phosphors 135, 137, 139, and may be transparent or translucent. The support 131 may be formed of, for example, a polymer including at least one of silicone, epoxy, poly(methyl methacrylate) (PMMA), and polyethylene (PE), or an inorganic material such as glass.

When the support 131 is formed of a polymer, the wavelength converter 130 may function as an encapsulant encapsulating the light emitting diode 102 while functioning to convert the wavelength of light emitted from the light emitting diode 102. In addition, the wavelength converter 130 may be disposed on the housing 101. When the housing 101 includes a cavity, as in this exemplary embodiment, the wavelength converter 130 may be placed in the cavity.

Further, an upper surface of the wavelength converter 130 may be formed in various shapes such as a convex lens shape, a flat plate shape (not shown), and a shape embossed in a predetermined pattern. Although the wavelength converter 130 is shown as having a convex lens shape herein, it should be understood that the shape of the wavelength converter is not limited thereto.

The red phosphor 135, the green phosphor 137, and the cyan phosphor 139 may be irregularly distributed in the support 131.

Specifically, the red phosphor 135 may be excited by incident light to emit red light, the green phosphor 137 may be excited by incident light to emit green light, and the cyan phosphor 139 may be excited by incident light to emit cyan light. Accordingly, the light emitting device according to this exemplary embodiment can emit white light through combination of violet light emitted from the light emitting diode 102 with the red light emitted from the red phosphor 135, the green light emitted from the green phosphor 137, and the cyan light emitted from the cyan phosphor 139.

In addition, the white light from the light emitting device according to this exemplary embodiment may have a CRI of 90 or higher.

The peak wavelength of the red light emitted from the red phosphor 135 may be in the range of 600 nm to 660 nm. The red phosphor 135 includes a first red phosphor 133 and a second red phosphor 134.

The first red phosphor 133 includes a phosphor represented by $A_2MF_6$:Mn, wherein A is any one selected from the group consisting of Li, Na, K, Rb, Ce, and $NH_4$, and M is any one selected from the group consisting of Si, Ti, Nb, and Ta. The first red phosphor 133 may emit light having a peak wavelength of 625 nm to 660 nm. The second red phosphor 134 may include a CASN phosphor. The CASN phosphor may emit light having a peak wavelength of 600 nm to 650 nm. The CASN phosphor may include a phosphor represented by $(Sr,Ca)AlSiN_3$:EU or $CaAlSiN_3$:EU.

The green phosphor 137 may include a silicate phosphor. The silicate phosphor may emit light having a peak wavelength of 520 nm to 550 nm. The silicate phosphor may include a phosphor represented by $(Ba,Sr,Ca)_2SiO_4$:EU.

The cyan phosphor 139 may include an LuAG phosphor. The LuAG phosphor may emit light having a peak wavelength of 490 nm to 550 nm. The LuAG phosphor may include a phosphor represented by $Lu_3Al_5O_{12}$:Ce or $Lu_3(Al,X)_5O_{12}$:Ce (where X is a group III element other than Al, and Al is partially substituted with an element of the same group, such as Ga or In). Specifically, the LuAG phosphor may include a phosphor represented by $Lu_3(Al,Ga)_5O_{12}$:Ce (where Al is partially substituted with Ga). Particularly, the phosphor represented by $Lu_3(Al,Ga)_5O_{12}$:Ce may emit light having a peak wavelength of 490 nm to 520 nm, specifically about 505 nm.

In the wavelength converter, a weight ratio of the second red phosphor 134 to the first red phosphor 133 may be 2.5 to 5:7.5 to 5. Specifically, in the wavelength converter, a weight ratio of the phosphor represented by $(Sr,Ca)AlSiN_3$:EU or $CaAlSiN_3$:EU to the phosphor represented by $A_2MF_6$:Mn may be 2.5 to 5:7.5 to 5, wherein A is any one selected from the group consisting of Li, Na, K, Rb, Ce, and $NH_4$, and M is any one selected from the group consisting of Si, Ti, Nb, and Ta.

In the wavelength converter, a weight ratio of the LuAG phosphor to the silicate phosphor may be 8 to 9.9:0.1 to 2. Specifically, in the wavelength converter, a weight ratio of the phosphor represent by $Lu_3Al_5O_{12}$:Ce or $Lu_3(Al,X)_5O_{12}$:

Ce (where X is a group III element other than Al) to the phosphor represented by $(Ba,Sr,Ca)_2SiO_4$:EU may be 8 to 9.9:0.1 to 2.

According to this exemplary embodiment, it is possible to provide a light emitting device which can provide a CRI of 90 or higher and excellent luminous intensity.

Specifically, the white light emitting device according to this exemplary embodiment may have a luminous intensity variation rate of higher than 100%, as calculated according to Equation 1.

Luminous intensity variation rate (%)=(F1/F0)×1/F   [Equation 1]

$F_1$: Luminous intensity (unit: lm) of light emitted from the light emitting device $F_0$: Luminous intensity (unit: lm) of light emitted from a light emitting device including a wavelength converter only including a LuAG phosphor represented by $Lu_3(Al,Ga)_5O_{12}$:Ce and a CASN phosphor represented by $(Sr,Ca)AlSiN_3$:EU as phosphors

Example and Comparative Example

Example 1: Fabrication of Light Emitting Device

Referring to FIG. 8, as a light emitting diode emitting a peak wavelength of about 425 nm, a rectangular light emitting chip having a size of 860 μm×540 μm was mounted on a lead frame (not shown).

A housing having a cavity was formed at the upper end of the lead frame using an epoxy molding compound (EMC) by transfer molding.

The phosphors according to the exemplary embodiments were mixed with 90% by weight of a silicone resin based on the total weight of the wavelength converter, thereby preparing a slurry, which was in turn poured into the cavity of the housing. Then, the silicone resin was cured through heat treatment at 150° C., thereby fabricating a light emitting device including a wavelength converter. Here, a predetermined number of phosphors were used such that an LED lamp had chromaticity (CIE) coordinates, x=0.458 to 0.462, y=0.412 to 0.417. In addition, in the wavelength converter, a weight ratio of the second red phosphor represented by $(Sr,Ca)AlSiN_3$:EU to the first red phosphor represented by $K_2SiF_6$:Mn was 4:6, and a weight ratio of the LuAG phosphor represented by $Lu_3(Al,Ga)_5O_{12}$:Ce to the silicate phosphor represented by $(Ba,Sr,Ca)_2SiO_4$:EU was 9:1.

Comparative Example 1: Fabrication of Light Emitting Device

A light emitting device was fabricated in the same manner as in Example 1 except that a weight ratio of the second red phosphor represented by $(Sr,Ca)AlSiN_3$:EU to the first red phosphor represented by $K_2SiF_6$:Mn was 7:3.

Comparative Example 2: Fabrication of Light Emitting Device

A light emitting device was fabricated in the same manner as in Example 1 except that a weight ratio of the second red phosphor represented by $(Sr,Ca)AlSiN_3$:EU to the first red phosphor represented by $K_2SiF_6$:Mn was 2:8.

Comparative Example 3: Fabrication of Light Emitting Device

A light emitting device was fabricated in the same manner as in Example 1 except that the first red phosphor represented by $K_2SiF_6$:Mn and the silicate phosphor represented by $(Ba,Sr,Ca)_2SiO_4$:EU were not used.

Experimental Example

CRI and R9 values of each of the light emitting devices fabricated in Example 1 and Comparative Examples 1 to 3 were measured by supplying power (rated current: 100 mA, voltage: 6.1 V) to the light emitting devices. In addition, after the flux (unit: lm) of each of the light emitting devices fabricated in Example 1 and Comparative Examples 1 to 3 was measured, the luminous intensity variation rate (Δ) of each of the light emitting devices of Example and Comparative Examples was expressed in % relative to the measured flux of the light emitting device of Comparative Example 3. Results are shown in Table 1.

Table 1

TABLE 1

|  |  |  | L/Flux | @equal CIE x, y |  |  |  |
|---|---|---|---|---|---|---|---|
|  | CIE x | CIE y | (lm) | Flux (lm) | Δ (%) | CRI | R9 |
| Example 1 | 0.460 | 0.413 | 71.0 | 71.7 | 104.4 | 91.1 | 40.0 |
| Comparative Example 1 | 0.460 | 0.416 | 72.3 | 72.3 | 105.4 | 89.1 | 33.5 |
| Comparative Example 1 | 0.460 | 0.416 | 67.9 | 67.9 | 99.0 | 94.5 | 60.2 |
| Comparative Example 3 | 0.460 | 0.416 | 68.0 | 68.6 | 100 | 92.4 | 43.6 |

Referring to Table 1, it can be seen that the light emitting device according to the exemplary embodiment had a CRI of 90 or higher and a luminous intensity variation rate of 104.4% and was thus increased in flux, as compared with the light emitting device of Comparative Example 3 not including the first red phosphor. Conversely, the light emitting device of Comparative Example 2 had a luminous intensity variation rate of 99.0% despite having a CRI of 90 or higher and was thus reduced in luminous intensity. In addition, it can be seen that the light emitting device of Comparative Example 1 exhibited a luminous intensity variation rate of 105.4% and was thus increased in luminous intensity, but had a CRI of 89.1 and thus exhibited poor color rendition. Since the numerical values of Comparative Example 3 are reference values, evaluation of Comparative Example 3 is meaningless.

Figure 9:
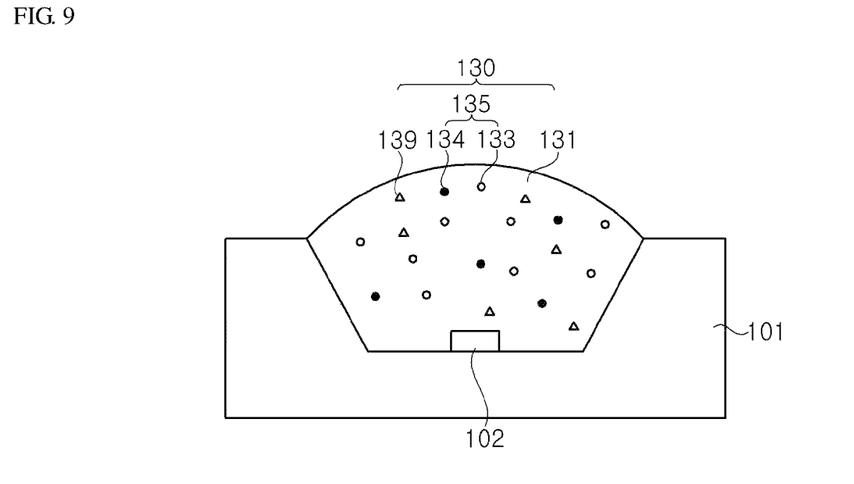
FIG. 9 is a schematic sectional view of a light emitting device according to yet another exemplary embodiment of the present disclosure.

FIG. 9 is a sectional view of a light emitting device according to yet another exemplary embodiment of the present disclosure.

Referring to FIG. 9, the light emitting device according to this exemplary embodiment includes a light emitting diode 102, a wavelength converter 130, and a housing 101.

In this exemplary embodiment, the light emitting diode 102 may be disposed on the housing 101. Here, the housing may be, for example, a base as shown in the drawing.

The housing may include a cavity open upward, and the light emitting diode 102 may be mounted in the cavity. The cavity may have an inclined inner side surface, such that light emitted from the light emitting diode 102 can be reflected from the side surface, thereby improving luminous efficiency of the light emitting device according to this exemplary embodiment. In addition, a reflective material may be further disposed on the inner side surface of the cavity.

When the base is formed as a housing, the housing may be formed of general plastics including polymers and the like, acrylonitrile butadiene styrene (ABS), liquid crystalline polymers (LCPs), polyamide (PA), polyphenylene sulfide (IPS), thermoplastic elastomers (TPEs), metals, or ceramics. However, it should be understood that other implementations are also possible.

In addition, the housing 101 may include at least two lead terminals, and the light emitting diode 102 may be electrically connected to the lead terminals. Through the lead terminals, the light emitting device can be connected to an external power source. Alternatively, the light emitting diode 102 may be disposed on the lead terminals.

Further, the housing 101 may further include any known components capable of supporting the light emitting diode 102. For example, the housing 101 may include a PCB or a conductive or insulating substrate on which the light emitting diode 102 is mounted, such as a lead frame, and may include a heat sink or the like for dissipating heat generated from the light emitting diode 102.

The light emitting diode 102 may include an n-type semiconductor layer and a p-type semiconductor layer to emit light through recombination of holes and electrons. The light emitting diode 102 may be a horizontal, vertical, or flip chip-type light emitting diode, and the configuration and shape of the light emitting diode 102 are not particularly limited.

The light emitting diode 102 can emit light having a peak wavelength in the visible range, particularly, light having a peak wavelength of 415 nm to 435 nm. Using the light emitting diode 102 that emits light having a peak wavelength in the above range, it is possible to prevent reduction in reliability and luminous efficiency of the light emitting device due to use of an ultraviolet light emitting diode and to minimize light emission at about 450 nm, thereby minimizing harmfulness to the human body.

The wavelength converter 130 may be placed on the light emitting diode 102 to cover at least part of the light emitting diode 102 or to encapsulate the light emitting diode 102. That is, the wavelength converter 130 may be positioned on a light emission path of the light emitting diode 102.

The wavelength converter 130 may include: a support 131; and a red phosphor 134 and a cyan phosphor 139 irregularly dispersed in the support 131.

The support 131 may be formed of any material capable of supporting first and second red phosphors 133, 135, and may be transparent or translucent. The support 131 may be formed of, for example, a polymer including at least one of silicone, epoxy, poly(methyl methacrylate) (PMMA), and polyethylene (PE), or an inorganic material such as glass.

When the support 131 is formed of a polymer, the wavelength converter 130 may function as an encapsulant encapsulating the light emitting diode 102 while functioning to convert the wavelength of light emitted from the light emitting diode 102. In addition, the wavelength converter 130 may be disposed on the housing 101. When the housing 101 includes a cavity, as in this exemplary embodiment, the wavelength converter 130 may be placed in the cavity. Further, an upper surface of the wavelength converter 130 may be formed in various shapes such as a convex lens shape, a flat plate shape (not shown), and a shape embossed in a predetermined pattern. Although the wavelength converter 130 is shown as having a convex lens shape herein, it should be understood that the shape of the wavelength converter is not limited thereto.

The red phosphor 134 and the cyan phosphor 139 may be irregularly distributed in the support 131.

Specifically, the red phosphor 134 may be excited by incident light to emit red light, and the cyan phosphor 139 may be excited by incident light to emit cyan light. Accordingly, the light emitting device according to this exemplary embodiment can emit white light through combination of violet light emitted from the light emitting diode 102 with the red light emitted from the red phosphor 134 and the cyan light emitted from the cyan phosphor 139.

In addition, the white light from the light emitting device according to this exemplary embodiment may have a CRI of 90 or higher. Further, the white light from the light emitting device according to this exemplary embodiment may have an R9 of 50 or higher.

The peak wavelength of the red light emitted from the red phosphor 134 may be in the range of 600 nm to 660 nm. The red phosphor 134 includes a first red phosphor 133 and a second red phosphor 134.

The first red phosphor 133 includes a phosphor represented by $A_2MF_6$:Mn, wherein A is any one selected from the group consisting of Li, Na, K, Rb, Ce, and NH4, and M is any one selected from the group consisting of Si, Ti, Nb, and Ta. The first red phosphor 133 may emit light having a peak wavelength of 625 nm to 660 nm.

The second red phosphor 134 may include a CASN phosphor. The CASN phosphor may emit light having a peak wavelength of 600 nm to 650 nm. The CASN phosphor may include a phosphor represented by $(Sr,Ca)AlSiN_3$:EU or $CaAlSiN_3$:EU.

The cyan phosphor 139 may include an LuAG phosphor. The LuAG phosphor may emit light having a peak wavelength of 490 nm to 550 nm. The LuAG phosphor may include a phosphor represented by $Lu_3Al_5O_{12}$:Ce or $Lu_3(Al,X)_5O_{12}$:Ce (where X is a group III element other than Al, and Al is partially substituted with an element of the same group, such as Ga or In). Specifically, the LuAG phosphor may include a phosphor represented by $Lu_3(Al,Ga)_5O_{12}$:Ce (where Al is partially substituted with Ga). Particularly, the phosphor represented by $Lu_3(Al,Ga)_5O_{12}$:Ce may emit light having a peak wavelength of 490 nm to 520 nm, specifically about 505 nm.

In the wavelength converter, a weight ratio of the second red phosphor 134 to the first red phosphor 133 may be 0.5 to 4:6.5 to 9.5. Specifically, in the wavelength converter, a weight ratio of the phosphor represented by $(Sr,Ca)AlSiN_3$: EU or $CaAlSiN_3$:EU to the phosphor represented by $A_2MF_6$: Mn may be 0.5 to 4:6.5 to 9.5, wherein A is any one selected from the group consisting of Li, Na, K, Rb, Ce, and NH4, and M is any one selected from the group consisting of Si, Ti, Nb, and Ta.

According to the exemplary embodiment, the light emitting device can provide a CRI of 90 or higher and an R9 of 50 or higher and exhibit excellent luminous intensity. Specifically, the light emitting device has a CRI of 90 or higher and an R9 of 50 and is reduced in luminous intensity by only 1% as compared with a typical light emitting device using only a CASN-based short wavelength red phosphor in combination with a violet light emitting diode and thus exhibits good luminous intensity.

Specifically, the white light emitting device according to this exemplary embodiment may have a luminous intensity variation rate of 98.8% or higher, as calculated according to Equation 1.

Luminous intensity variation rate (%)=$(F1/F0) \times 100$. [Equation 1]

$F_1$: Luminous intensity (unit: lm) of light emitted from the light emitting device $F_0$: Luminous intensity (unit: lm) of light emitted from a light emitting device including a wavelength converter only including a CASN phosphor represented by $(Sr,Ca)AlSiN_3$:

EU and an LuAG phosphor represented by $Lu_3Al_5O_{12}:Ce$ or $Lu_3(Al,X)_5O_{12}:Ce$ (where X is a group III element other than Al) as phosphors Example and Comparative Example Example 2: Fabrication of Light Emitting Device Referring to FIG. 9, as a light emitting diode emitting a peak wavelength of about 425 nm, a rectangular light emitting chip having a size of 860 μm×540 μm was mounted on a lead frame (not shown).

A housing having a cavity was formed at the upper end of the lead frame using an epoxy molding compound (EMC) by transfer molding.

The phosphors according to the exemplary embodiments were mixed with 90% by weight of a silicone resin based on the total weight of the wavelength converter, thereby preparing a slurry, which was in turn poured into the cavity of the housing. Then, the silicone resin was cured through heat treatment at 150° C., thereby fabricating a light emitting device including a wavelength converter. Here, a predetermined number of phosphors were used such that an LED lamp had chromaticity (CIE) coordinates, x=0.458 to 0.462, y=0.409 to 0.417.

In addition, the wavelength converter included the second red phosphor represented by $(Sr,Ca)AlSiN_3:EU$ and the first red phosphor represented by $K_2SiF_6:Mn$ in a weight ratio of 3:7 and also included an LuAG phosphor represented by $Lu_3(Al,Ga)_5O_{12}:Ce$.

Example 3: Fabrication of Light Emitting Device

A light emitting device was fabricated in the same manner as in Example 2 except that a weight ratio of the second red phosphor represented by $(Sr,Ca)AlSiN_3:EU$ to the first red phosphor represented by $K_2SiF_6:Mn$ was 2:8.

Comparative Example 4: Fabrication of Light Emitting Device

A light emitting device was fabricated in the same manner as in Example 2 except that the first red phosphor represented by $K2SiF_6:Mn$ was not used.

Comparative Example 5: Fabrication of Light Emitting Device

A light emitting device was fabricated in the same manner as in Example 2 except that a CASN phosphor represented by $CaAlSiN_3:EU$ was used instead of the first red phosphor represented by $K_2SiF_6:Mn$, and a weight ratio of the second red phosphor represented by $(Sr,Ca)AlSiN_3:EU$ to the CASN phosphor represented by $CaAlSiN_3$ was 7:3.

Comparative Example 6: Fabrication of Light Emitting Device

A light emitting device was fabricated in the same manner as in Example 2 except that a weight ratio of the second red phosphor represented by $(Sr,Ca)AlSiN_3:EU$ to the first red phosphor represented by $K_2SiF_6:Mn$ was 4:6.

Comparative Example 7: Fabrication of Light Emitting Device

A light emitting device was fabricated in the same manner as in Example 2 except that a weight ratio of the second red phosphor represented by $(Sr,Ca)AlSiN_3:EU$ to the first red phosphor represented by $K2SiF_6:Mn$ was 7:3.

Experimental Example

CRI and R9 values of each of the light emitting devices fabricated in Example 2 and Comparative Examples 4 to 4 were measured by supplying power (rated current: 100 mA, voltage: 6.1 V) to the light emitting devices. In addition, after the flux (unit: lm) of each of the light emitting devices fabricated in Example 2 and Comparative Examples 4 to 4 was measured, the luminous intensity variation rate (Δ) of each of the light emitting devices of Examples and Comparative Examples was expressed in % relative to the measured flux of the light emitting device of Comparative Example 4. Results are shown in Table 2.

TABLE 2

| | | | @equal CIE x, y | | | | |
|---|---|---|---|---|---|---|---|
| | CIE x | CIE y | L/Flux (lm) | Flux (lm) | Δ (%) | CRI | R9 |
| Example 2 | 0.460 | 0.416 | 68.4 | 68.4 | 99.7 | 93.0 | 53.4 |
| Example 3 | 0.460 | 0.416 | 67.9 | 67.9 | 99.0 | 93.7 | 61.2 |
| Comparative Example 4 | 0.460 | 0.416 | 68.0 | 68.6 | 100.0 | 92.4 | 43.6 |
| Comparative Example 5 | 0.460 | 0.416 | 65.5 | 65.5 | 95.5 | 93.6 | 53.1 |
| Comparative Example 6 | 0.460 | 0.410 | 67.9 | 69.2 | 100.9 | 92.5 | 48.2 |
| Comparative Example 7 | 0.460 | 0.413 | 68.6 | 69.3 | 101.0 | 92.9 | 45.5 |

As shown in Table 2, the light emitting devices of Examples 2 and 3 had a CRI of 90 or higher, an R9 of 50 or higher, and a luminous intensity variation rate of 99.0% or 99.7%. Thus, it can be seen that the light emitting devices according to the exemplary embodiments of the present disclosure were reduced in luminous intensity by only 1% or less, as compared with the light emitting device of Comparative Example 4 not using the first red phosphor and thus exhibited good luminous intensity. Conversely, the light emitting devices of Comparative Examples 4, 3, and 4 had a CRI of 90 or higher and an R9 of 50 or less, and the light emitting device of Comparative Example 5 had a CRI of 90 or higher and an R9 of 50 or higher, but had a luminous intensity variation rate of 95.5% and thus was reduced in luminous intensity by 4% or more, as compared with the light emitting device of Comparative Example 4 not using the first red phosphor. Therefore, it can be seen that phosphors are required to be used in a specific weight ratio so as to provide a light emitting device having a CRI of 90 or higher, an R9 of 50 or higher, and excellent luminous intensity.

Although some exemplary embodiments have been described herein, it should be understood that these embodiments are provided for illustration only and are not to be construed in any way as limiting the present disclosure, and that various modifications, changes, alterations, and equivalent embodiments can be made by those skilled in the art without departing from the spirit and scope of the present disclosure. The scope of the present disclosure should be defined by the appended claims and equivalents thereof.

The invention claimed is:

1. A white light emitting device, comprising:
a housing;
a light emitting diode chip disposed in the housing and configured to emit light having a peak wavelength in a first blue wavelength band and a Full Width at Half Maximum (FWHM) of 40 nm or less at the peak wavelength;
a wavelength converter disposed on the light emitting diode chip;
a first phosphor distributed in the wavelength converter and configured to emit light having a peak wavelength in a cyan wavelength band;
a second phosphor distributed in the wavelength converter and configured to emit light having a peak wavelength in a red wavelength band; and
a buffer portion disposed between the light emitting diode chip and the wavelength converter,
wherein:
the second phosphor includes a first red phosphor and a second red phosphor and the first red phosphor and the second red phosphor are formed of different materials;
a white light is configured to be formed by a synthesis of light emitted from the light emitting diode chip, the first phosphor, the first red phosphor, and the second red phosphor, and
the white light emitted from the light emitting device has a color rendering index (CRI) of 90 or higher.

2. The white light emitting device according to claim 1, wherein the first phosphor comprises at least one of LuAG, YAG, nitride, and silicate phosphors.

3. The white light emitting device according to claim 1, wherein the second phosphor comprises at least one of CASN, CASON, and SCASN phosphors.

4. The white light emitting device according to claim 1, further comprising:
a third phosphor distributed in the wavelength converter and configured to emit light having a peak wavelength in a second blue wavelength band, the third phosphor comprising at least one of SBCA, BAM, silicate, and nitride phosphors.

5. The white light emitting device according to claim 1, wherein the first red phosphor comprises a phosphor represented by $A_2MF_6$:Mn, wherein A is selected from the group consisting of Li, Na, K, Rb, Ce, and $NH_4$, and M is selected from the group consisting of Si, Ti, Nb, and Ta.

6. The white light emitting device according to claim 1, wherein the housing further comprises a reflector disposed on a side wall of the housing spaced from the light emitting diode chip.

7. The white light emitting device according to claim 6, wherein the housing further comprises a barrier reflector covering the reflector.

8. A white light emitting device, comprising:
a housing;
a light emitting diode chip disposed in the housing and configured to emit light having a peak wavelength in a first blue wavelength band and a Full Width at Half Maximum (FWHM) of 40 nm or less at the peak wavelength;
a wavelength converter disposed on the light emitting diode chip;
a first phosphor distributed in the wavelength converter and configured to emit light having a peak wavelength in a green wavelength band; and
a second phosphor distributed in the wavelength converter and configured to emit light having a peak wavelength in a red wavelength band,
wherein:
the second phosphor includes a first red phosphor and a second red phosphor and the first red phosphor and the second red phosphor are formed of different materials;
a white light is configured to be formed by a synthesis of light emitted from the light emitting diode chip, the first phosphor, the first red phosphor, and the second red phosphor;
40% or more of an optical spectrum of the white light being distributed in a wavelength range of 500 nm to 600 nm, and
the white light emitted from the light emitting device has a color rendering index (CRI) of 90 or higher.

9. The white light emitting device according to claim 8, wherein the first phosphor comprises at least one of LuAG, YAG, nitride, and silicate phosphors.

10. The white light emitting device according to claim 8, wherein the second phosphor comprises at least one of CASN, CASON, and SCASN phosphors.

11. The white light emitting device according to claim 8, further comprising:
a third phosphor distributed in the wavelength converter and configured to emit light having a peak wavelength in a second blue wavelength band, the third phosphor comprising at least one of SBCA, BAM, silicate, and nitride phosphors.

12. The white light emitting device according to claim 8, wherein the first red phosphor comprises a phosphor represented by $A_2MF_6$:Mn, wherein A is selected from the group consisting of Li, Na, K, Rb, Ce, and $NH_4$, and M is selected from the group consisting of Si, Ti, Nb, and Ta.

13. The white light emitting device according to claim 8, further comprising:
a buffer portion disposed between the wavelength converter and the light emitting diode chip, wherein the buffer portion has lower hardness than the wavelength converter.

14. The white light emitting device according to claim 8, wherein the housing further comprises a reflector disposed on a side wall of the housing spaced from the light emitting diode chip.

15. The white light emitting device according to claim 14, wherein the housing further comprises a barrier reflector covering the reflector.

16. A white light emitting device, comprising:
a housing;
a light emitting diode chip disposed in the housing and configured to emit light having a peak wavelength in a first blue wavelength band and a Full Width at Half Maximum (FWHM) of 40 nm or less at the peak wavelength;
a wavelength converter disposed on the light emitting diode chip;
a first phosphor distributed in the wavelength converter and configured to emit light having a peak wavelength in a green wavelength band; and
a second phosphor distributed in the wavelength converter and configured to emit light having a peak wavelength in a red wavelength band,
wherein:
the wavelength converter includes a first wavelength converter and a second wavelength converter and the second wavelength converter covers the first wavelength converter and is formed of material having a different hardness;

the second phosphor includes a first red phosphor and a second red phosphor and the first red phosphor and the second red phosphor are formed of different materials, and a white light is configured to be formed by a synthesis of light emitted from the light emitting diode chip, the first phosphor, the first red phosphor, and the second red phosphor.

17. The white light emitting device according to claim 16, further comprising:

a third phosphor distributed in the wavelength converter and configured to emit light having a peak wavelength in a second blue wavelength band, the third phosphor comprising at least one of SBCA, BAM, silicate, and nitride phosphors.

18. The white light emitting device according to claim 16, further comprising:

a buffer portion disposed between the wavelength converter and the light emitting diode chip, wherein the buffer portion has lower hardness than the wavelength converter.

19. The white light emitting device according to claim 16, wherein the housing further comprises a reflector disposed on a side wall of the housing spaced from the light emitting diode chip.

20. The white light emitting device according to claim 19, wherein the housing further comprises a barrier reflector covering the reflector.

* * * * *